United States Patent [19]

Weiner

[11] 4,140,917
[45] Feb. 20, 1979

[54] FAST RISETIME SPIRAL PULSE GENERATOR

[75] Inventor: Maurice Weiner, Ocean Township, Ocean County, N.J.

[73] Assignee: The United States of America as represented by the Secretary of the Army, Washington, D.C.

[21] Appl. No.: 817,272

[22] Filed: Jul. 20, 1977

[51] Int. Cl.² ............................................ H03K 3/00
[52] U.S. Cl. ........................................ 307/106; 320/1
[58] Field of Search .................... 320/1; 307/106, 107, 307/108, 109, 110

[56] References Cited

U.S. PATENT DOCUMENTS

| | | | |
|---|---|---|---|
| 2,884,605 | 4/1959 | Dubilier | 307/110 |
| 3,289,015 | 11/1966 | Fitch et al. | 307/110 |
| 3,322,976 | 5/1967 | Blank | 307/110 X |

Primary Examiner—James R. Scott
Assistant Examiner—Morris Ginsburg
Attorney, Agent, or Firm—Nathan Edelberg; Jeremiah G. Murray; Edward Goldberg

[57] ABSTRACT

A vector inversion stacked stripline pulse generator adapted for single switch initiation consisting of a relatively long laminated assembly of alternate layers of dielectric and metallization wound on a non-magnetic cylindrical form with the metallization layers interconnected as two separate sets of mutually overlying conductors which are selectively connected together in a spiral around the outer periphery of the cylindrical form, thereby providing a compact pulser which is capable of providing a relatively faster risetime output pulse over conventional designs.

10 Claims, 12 Drawing Figures

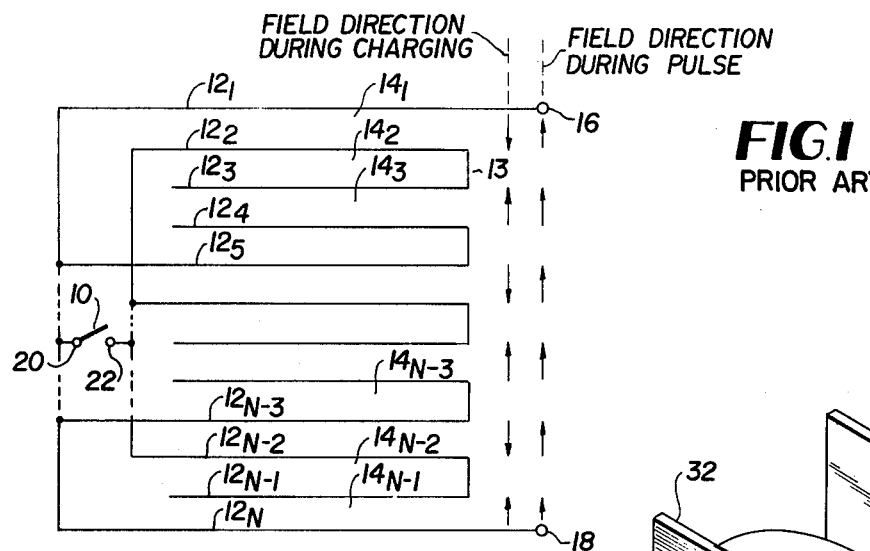
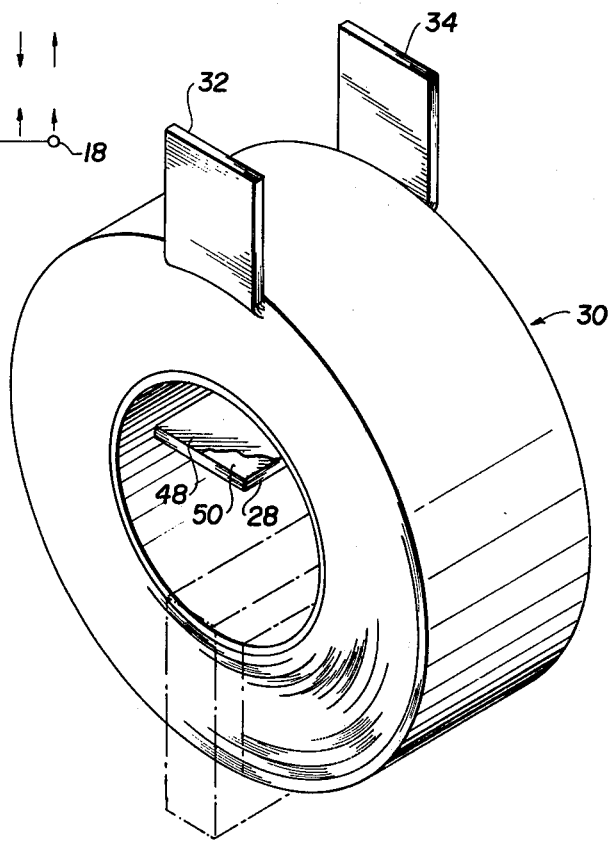
FIG.1 PRIOR ART
FIG.2
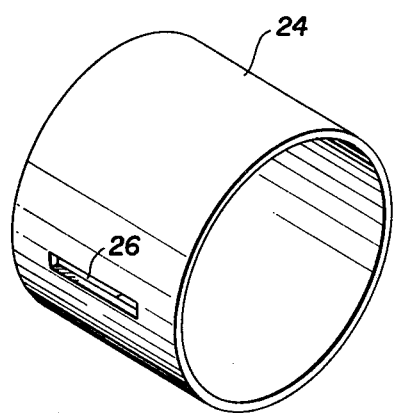
FIG.5
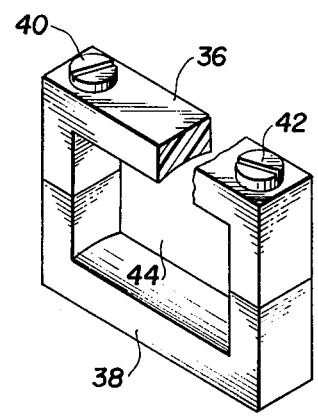
FIG.6

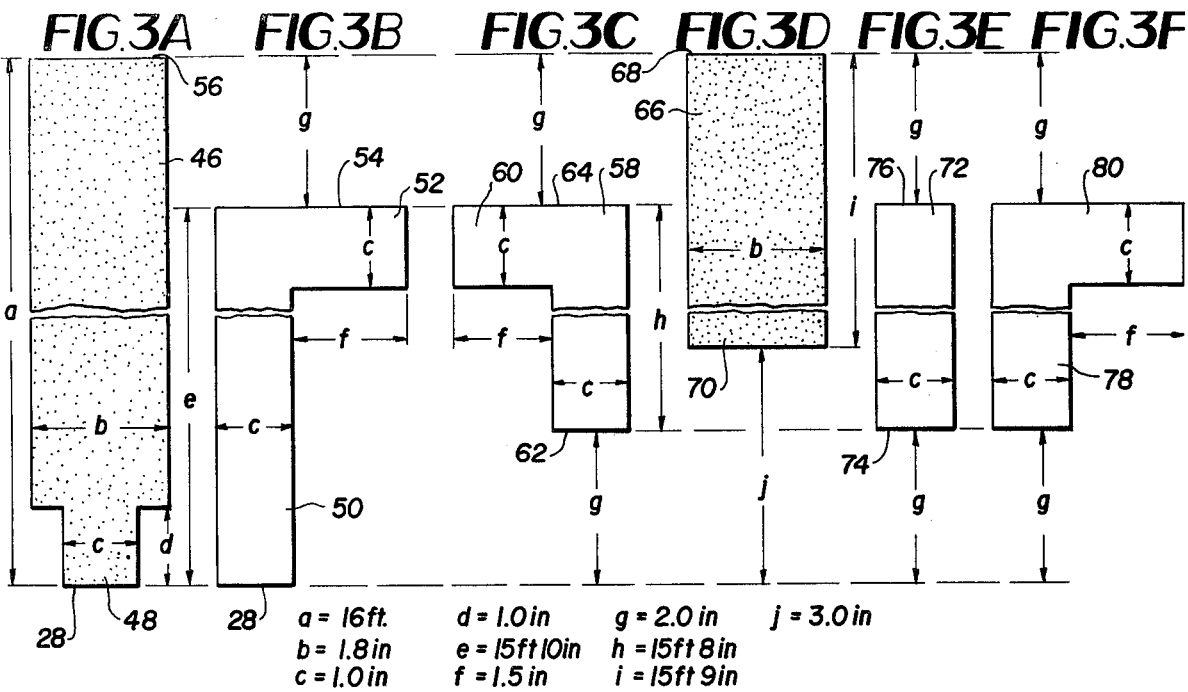
FIG.3A  FIG.3B  FIG.3C  FIG.3D  FIG.3E  FIG.3F
a = 16 ft.   d = 1.0 in   g = 2.0 in   j = 3.0 in
b = 1.8 in   e = 15 ft 10 in   h = 15 ft 8 in
c = 1.0 in   f = 1.5 in   i = 15 ft 9 in
| LAYER | FIG | LAYER | FIG | LAYER | FIG | LAYER | FIG | LAYER | FIG |
|---|---|---|---|---|---|---|---|---|---|
| 1 | 3A | 11 | 3A | 21 | 3D | 31 | 3A | 41 | 3D |
| 2 | 3B | 12 | 3C | 22 | 3E | 32 | 3E | 42 | 3F |
| 3 | 3A | 13 | 3D | 23 | 3A | 33 | 3D | 43 | 3A |
| 4 | 3C | 14 | 3E | 24 | 3E | 34 | 3F | 44 | 3C |
| 5 | 3D | 15 | 3A | 25 | 3D | 35 | 3A | 45 | 3D |
| 6 | 3E | 16 | 3E | 26 | 3F | 36 | 3C | 46 | 3E |
| 7 | 3A | 17 | 3D | 27 | 3A | 37 | 3D | 47 | 3A |
| 8 | 3E | 18 | 3F | 28 | 3C | 38 | 3E | 48 | 3B |
| 9 | 3D | 19 | 3A | 29 | 3D | 39 | 3A | 49 | 3A |
| 10 | 3F | 20 | 3C | 30 | 3E | 40 | 3E | | |
FIG.4
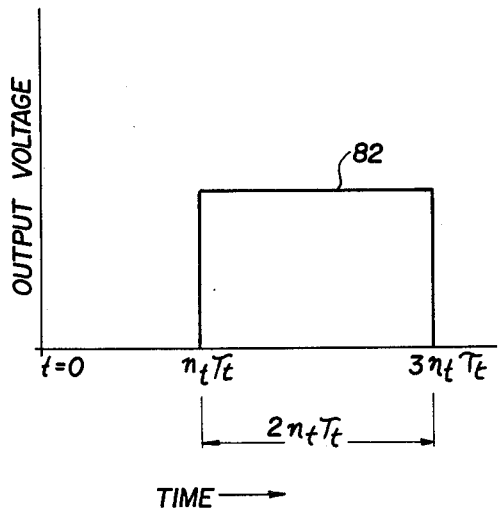
FIG.7

FAST RISETIME SPIRAL PULSE GENERATOR

The invention described herein may be manufactured and used by or for the Government for governmental purposes without the payment of any royalties thereon or therefor.

BACKGROUND OF THE INVENTION

The present invention relates generally to generators of electrical pulses and more particularly to the type of pulse generator which operates on the principle of the transient reversal of voltages in alternate units of series connected systems.

Pulse generators operating on the principle of vector inversion have been described in a printed publication entitled "Novel Principle of Transient High Voltage Generation", by R.A. Fitch, et al. which appeared in the April, 1964, issue of the Proceedings of the Institution of Electrical Engineers, Volume 111, No. 4, at pages 849–855, inclusive, and also in U.S. Pat. No. 3,289,015, entitled "Pulse Generator", R.A. Fitch, et al., which issued on Nov. 29, 1966.

In such apparatus where a voltage V is initially applied to the spiral at one end, the subsequent closure of a spark gap switch at the other end will cause a transient voltage to be developed of 2nV, where n is the number of turns in the spiral. As noted in these references, the pulse shape produced is inherently triangular in nature, with a total pulsewidth of 2 nT, where T is the propagation time for a single turn.

Many applications require nanosecond pulses with a fast rise time and a flat top, i.e. a square wave rather than a triangular wave. Whereas the referenced prior art also directs its attention to means for providing faster risetimes, the present invention is directed to yet a further improvement in such apparatus for developing a square shaped output pulse.

SUMMARY

Briefly, the subject invention is directed to a vector inversion pulse generator consisting of plural layers of stripline conductor material of predetermined long length separated by respective dielectric layers having a thickness equal to the thickness of the conductor material for providing N conductor lines which are wound in a spiral on a cylindrical form comprised of electrically insulating material. One like end of the first and Nth conductor line is adapted to provide a pair of output leads while the opposite ends thereof are connected in parallel to first terminal means of first and second terminal means which are adapted to receive a charging voltage thereacross and be connected to a triggered spark gap switch. The intermediate conductor lines have alternately adjacent like ends connected in series forming two sets of conductor lines with the opposite end of one set of conductors coupled in parallel to form said first terminal means and with the like opposite end of the other set of conductors coupled in parallel to form said second terminal means. The output leads consisting of the respective ends of the first and last conductor project through a slot in the cylindrical form while the first and second terminal means consisting of the end portions of predetermined conductor lines project outwardly from the spiral for connection to the spark gap switch.

BRIEF DESCRIPTION OF THE DRAWINGS

FIG. 1 is an electrical schematic diagram illustrative of the electrical circuit resulting from the subject invention;

FIG. 2 is a perspective view of the preferred embodiment of the subject invention;

FIG. 3A through 3F are scaled representations of the various layers of electrical conductor and dielectric material which are selectively placed one on top of another to form a laminated assembly resulting in the preferred embodiment of the subject invention;

FIG. 4 is a tabulation of the required layer configuration to result in the electrical circuit as shown in FIG. 1;

FIG. 5 is a perspective view of the cylindrical form upon which the laminated assembly is wound;

FIG. 6 is a perspective view of a mounting clamp for holding the embodiment of the subject invention shown in FIG. 2; and FIG. 7 is a graphical illustration of the voltage output waveform provided by the subject invention.

DESCRIPTION OF THE PREFERRED EMBODIMENT

Referring now to FIG. 1, there is disclosed a known prior art circuit diagram which operates on the principle of vector inversion. In this circuit, a single switching element 10 is coupled to a selectively interconnected plurality of electrical conductor lines $12_1$, $12_2$, $12_3$... $12_{N-1}$, $12_N$, which are in mutual registration and separated by dielectric regions $14_1$, $14_2$... $14_{N-1}$. Like terminal ends of the first and last or Nth conductor line $12_1$ and $12_N$ are adapted to be connected to respective output terminals 16 and 18, while their opposite ends are adapted to be connected in parallel to switch terminal 20. The intermediate conductor lines $12_2$ through $12_{N-1}$ have alternately adjacent like ends coupled in series forming two sets of conductors with the opposite end of one set of conductors coupled in parallel to one side of the switch 10 at terminal 20, while the opposite end of the other set of conductors is coupled in parallel to the other side of the switch 10 at terminal 22. For example, conductor lines $12_2$ and $12_3$ are connected in series at junction region 13 such that conductor line $12_2$ is connected to switch terminal 22 while one end of conductor line $12_3$ is open ended. Adjacent the pair of conductor lines $12_2$ and $12_3$ are the series connected conductor lines $12_4$ and $12_5$, having one end of conductor line $12_5$ connected to switch terminal 20, while the end of conductor line $12_4$ is open ended in the same fashion as conductor line $12_3$. This pattern is repeated throughout the remaining intermediate conductor lines to the line $12_{N-1}$.

With the switch 10 open and a voltage V applied across terminals 20 and 22, an electrostatic electric field vector pattern in series opposition will build up as shown in FIG. 1 between pairs of adjacent conductor lines, e.g. $12_1$ and $12_2$, having an electric field vector in the first direction, while an electric field vector in the opposite direction is produced between conductor lines $12_3$ and $12_4$. Upon subsequent closing of the switch 10, alternate lines are simultaneously switched, so that their electric field vectors are reversed at the open ends and as a consequence, convert the initial series opposition of the vectors to series concurrence, providing a resultant voltage of 2mV where V is the amplitude of one field vector, i.e. the charging voltage, and m is the number of vector pairs. The reversal of alternate field vectors is also shown in FIG. 1 between output terminals 16 and 18.

Because the output voltage developed results from incident and reflective voltages propagating on the conductor lines $12_1 \ldots 12_N$, the risetime is degraded as the line length is increased. In an effort to counteract this inherent limitation, the present invention is directed to the circuit shown in FIG. 1 fabricated as a stacked stripline configuration wound in a spiral on a cylindrical form as shown in FIG. 2 and being configured from alternate layers of dielectric and electrical conductor elements arranged according to tabulation shown in FIG. 4. Referring now to FIG. 2, reference numeral 24 denotes a cylindrical coil form, being comprised of nonmagnetic material such as bakelite, for example, and having the following typical dimensions: outside diameter = 2.25 inches, thickness = 0.06 inches and outside surface width = 1.8 inches. A perspective view of the cylindrical coil form 24 is illustrated in FIG. 5 and is shown including a slot 26 which is adapted to be, for example, 1.0 inches long and 0.125 inches wide. Accordingly, slot 26 is adapted to accommodate one (output) end 28 of the stripline conductor assembly 30 when wound on the cylindrical form 24. The output end 28 includes the end portions of the first and last conductor line $12_1$ and $12_N$, which terminate in respective terminal portions adapted to be connected to output terminals 16 and 18, shown in FIG. 1. Reference numerals 32 and 34 depict end portions of specified conductor lines as dictated by the tabulation shown in FIG. 4, which are electrically connected together using silver epoxy, for example, whereby parallel connections are made so that connection to a triggered spark gap switch, not shown, can be connected thereto as shown schematically in FIG. 1 by having one set of conductor lines coupled in parallel to switch terminal 20, while the other set of conductor lines is connected in parallel to switch terminal 22.

The entire coil assembly shown in FIG. 2 is adapted to be mounted in a clamp shown in detail in FIG. 6, and which comprises two opposing U-shaped members 36 and 38, which when placed together and fastened by means of set screws 40 and 42, provides an inner region 44 which is adapted to accommodate and width dimension of the cylindrical form 24, as well as the combined thickness of the form and the stripline conductor assembly 30 when wound thereon.

Referring now to FIGS. 3A through 3F, there is disclosed embodiments of the various layers which are sandwiched together to form the laminated stripline assembly 30 shown in FIG. 2. FIGS. 3A through 3F are illustrated side-by-side to depict the relative position of the respective end portions of the layers so that as the "sandwich" is formed by placing layer number 2 upon layer number 1 and layer number 3 upon layer number 4 according to the tabulation shown in FIG. 4, the resultant conductor line configuration shown in FIG. 1 will result therefrom.

Referring to FIG. 3A, reference numeral 46 denotes a relatively long length a = 16.0 feet dielectric strip comprised of mylar, for example, and having a typical thickness of 0.001 inches. The width of dielectric strip 46 is relatively narrow b = 1.8 inches to accommodate the 1.8 inch width of the cylindrical form 24. The end portion of the dielectric strip 46 at 28 is narrowed to a c = 1.0 inch x d = 1.0 inch region 48. Over the dielectric strip 46 is laid an e = 15 feet 10 inch strip 50 of copper, also in the order of 0.001 inches thick. As shown in FIG. 3B, the end 28 of the copper strip 50 coincides with the end region 48 of the dielectric layer 46. The opposite end of the copper strip 50 terminates in a right angular tab portion 52 which is in the order of f = 1.5 inches long. It is to be noted also that the far edge 54 of the strip 50 is g = 2.0 inches from the far edge 56 of the dielectric layer 46.

The third layer consists of another dielectric layer 46 as shown in FIG. 3A, as evidenced by the tabulation shown in FIG. 4. The fourth layer comprises a 0.001 inch thick copper strip 58, which also has a length h = 15 feet 8.0 in. and having a right angular tab region 60 pointing in the opposite direction from the region 52 shown in FIG. 3B. The forward edge 62 lies g = 2.0 inches from the end 28 and has a far edge 64 which is g = 2.0 inches from the edge 56 shown in FIG. 3A. The fifth layer constitutes a dielectric layer 66 shown in FIG. 3D and consists of an i = 15 feet 9.0 inch length of mylar having its far edge 68 coincident with the far edge 56 of the first dielectric layer 46. The width of the dielectric strip 66 is of the same dimension as are all dielectric strips, that is b = 1.8 inches. However, the near edge 70 terminates j = 3.0 inches short of the end 28 of the dielectric strip 46 shown in FIG. 3A. The sixth layer 72 constitutes a straight copper strip h = 15 feet 8.0 inches in length and c = 1.0 inch in width and having a near edge 74 which is located g = 2.0 inches from the end 28. Far edge 76 in a like manner stops g = 2.0 inches from the rear edges 56 and 68 of the dielectric layers 46 and 66.

Accordingly, a repetitive pattern according to the tabulation of FIG. 4 is provided for each eight layers from the third layer 3A to the forty second. whereupon a last copper strip 78 as shown in FIG. 3F is provided. The copper layer 78 is dimensionally the same as the copper strip 58 shown in FIG. 3C with the exception that it includes a tab region 80 located on the opposite edge of lengthwise dimensional portion of the strip 58 relative to the tab region 60.

In the preferred embodiment of the subject invention, 49 layers of alternating dielectric and copper conductor strips are sandwiched together in a laminated assembly according to the tabulation of FIG. 4 with adjacent copper strips having end portions in contact with one another which are respectively connected using silver epoxy. The assembly thus configured forms the circuit shown in FIG. 1 which is then wound on the cylindrical form 24 and when operated by applying a charging voltage V, for example, across end portions 32 and 34 which are connected to switch terminals 20 and 22 and subsequently closing the switch 10 provides an output pulse 82 which is square rather than triangular.

As shown in FIG. 7, the pulsewidth is equal to $2n_t\tau_t$ where $n_t$ is the number of turns and $\tau_t$ is the average one way propagation time for a single turn. If t = 0 represents the closing of the switch 10, the leading edge of the output pulse is delayed by an amount $n_t\tau_t$ which for many applications is unimportant.

The voltage gain of the pulser shown in FIG. 2 is dependent upon the relative values of the dielectric thicknesses between conductor lines, for example, the dielectric layers $14_2$ and $14_3$, which can be designated $L_1$ and $L_2$, respectively. Accordingly, the gain can be stated as:

$$\text{GAIN} = N'(2L_2/L_1\ 30\ 2L_2) \tag{1}$$

where $N' = N/2 + 1$, N being the total number of conducting strips. In the example given $L_1 = L_2$ and $N' = 12$. The gain is accordingly $12 \times (0.67) = 8.04$. Larger gain may be obtained if $N'$ is made larger or if $L_2$ is chosen larger than $L_1$. For example, if $L_1 = 0.001$ in. and $L_2 = 0.002$ in., the gain will be $12 \times (0.8) = 9.6$.

Accordingly, the subject invention provides a compact means for generating high voltage, fast risetime pulses of short pulsewidth (nanoseconds) which is particularly adapted for laser applications.

Having thus shown and described what is at present considered to be the preferred embodiment of the subject invention,

I claim:

1. An electric field vector inversion pulse generator consisting of a spiral of electrical conductor lines separated by respective layers of insulation wherein the improvement comprises:

a generally cylindrical coil form;

first and second circuit means adapted to receive a charging voltage thereacross; switch means connected to said first and second circuit means for thereafter effecting a discharge of said voltage, said first and second circuit means being connected respectively to opposite sides of said switch means;

a laminated assembly of N mutually overlying stripline conductors of a relatively long length dimension in comparison to their width and thickness dimensions separated by respective layers of insulation having generally a width dimension greater than the width dimension of said conductors and of substantially the same thickness as the thickness dimension of said conductors, said assembly being wound in a spiral around the outer surface of said coil form;

wherein the first and Nth conductors have a respective one end located at the same end of said assembly including a pair of output leads and terminals at said one end and having a respective opposite end commonly coupled to said first circuit means at one side of said switch means, and wherein the second through N-1 conductors have alternate adjacent like ends connected in series forming two sets of conductors, with the opposite ends of one set of conductors being coupled in parallel to form said first circuit means and with the opposite ends of the other set of conductors coupled in parallel to form said second circuit means, each of said conductors and layers of insulation being of individual lengths and widths selected from a given set of dimensions and being wound around said coil form in a given sequence having a repetitive pattern of said lengths and widths, the application of said charging voltage to said selected repetitive pattern of lengths and widths of conductors and insulation layers and the subsequent discharge thereof producing a substantially square wave output pulse across said output leads.

2. The pulse generator as defined by claim 1 wherein said coil form is comprised of non-magnetic material.

3. The pulse generator as defined by claim 2 wherein said coil form has an outside surface width dimension substantially equal to at least the width dimension of said layers of insulation.

4. The pulse generator as defined by claim 1 wherein selected layers of insulation include respective like end portions at said same end as one end of said first and Nth conductors and having a reduced width dimension substantially equal to the width dimension of said first and Nth conductors, and wherein said coil form includes a slot adapted to receive said same end of said assembly therethrough which thereby projects said output leads interiorally of said cylindrical coil form.

5. The pulse generator as defined by claim 4 wherein the remainder of said layers of insulation have respective one end portions terminating a selected distance away from said reduced width end portions of said selected layers of insulation.

6. The pulse generator as defined by claim 5 wherein said first and Nth conductors include end tab portions at the opposite ends thereof projecting away from a first edge of the respective conductor.

7. The pulse generator as defined by claim 6 wherein said second through N-1 conductors have like end portions which are adapted to extend beyond said one end portion of the remainder of said layers of insulation to effect selected series connections thereof and having opposite end portions terminating a predetermined distance back away from the far end portion of said insulation layers, wherein selected ones of said second through N-1 conductors include electrically connected end tab portions at said opposite end portions projecting from a said first edge and being connected to a like end tab portion of said first and Nth conductors, and wherein selected other ones of said second through N-1 conductors include electrically connected end tab portions projecting from a second edge of said conductors, said connected like tab portions at said first and second edges forming said first and second circuit means.

8. The pulse generator as defined by claim 7 wherein said end tab portions have a width dimension substantially equal to the width dimension of the remainder of the respective conductor.

9. The pulse generator as defined by claim 8 wherein said end tab portions have a length dimension at least equal to said width dimension.

10. The pulse generator as defined by claim 1 wherein said switch means comprises a triggered spark gap switch.

* * * * *